(12) United States Patent
Tomikawa et al.

(10) Patent No.: US 7,233,495 B2
(45) Date of Patent: Jun. 19, 2007

(54) CIRCUIT CONFIGURATION MEMBER AND METHOD OF FABRICATING THE SAME

(75) Inventors: Tadashi Tomikawa, Mie (JP); Tomoki Kanou, Mie (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 290 days.

(21) Appl. No.: 10/928,206

(22) Filed: Aug. 30, 2004

(65) Prior Publication Data

US 2005/0047095 A1  Mar. 3, 2005

(30) Foreign Application Priority Data

Aug. 29, 2003 (JP) .............................. 2003-306180

(51) Int. Cl.
  *H05K 7/20* (2006.01)
(52) U.S. Cl. ...................... 361/719; 361/714; 165/80.2
(58) Field of Classification Search .................... None
  See application file for complete search history.

(56) References Cited

U.S. PATENT DOCUMENTS

| | | | | |
|---|---|---|---|---|
| 4,754,418 A | * | 6/1988 | Hara | 361/683 |
| 4,876,441 A | * | 10/1989 | Hara et al. | 235/488 |
| 5,526,234 A | * | 6/1996 | Vinciarelli et al. | 361/740 |
| 5,786,548 A | * | 7/1998 | Fanucchi et al. | 174/50.54 |
| 6,201,696 B1 | * | 3/2001 | Shimizu et al. | 361/704 |
| 6,307,749 B1 | * | 10/2001 | Daanen et al. | 361/704 |
| 6,374,912 B1 | * | 4/2002 | LaGrotta et al. | 165/185 |
| 6,459,586 B1 | * | 10/2002 | Miller et al. | 361/719 |
| 6,560,115 B1 | * | 5/2003 | Wakabayashi et al. | 361/728 |
| 6,775,141 B2 | * | 8/2004 | Yoshida et al. | 361/719 |

FOREIGN PATENT DOCUMENTS

JP  2003-164039  6/2003

\* cited by examiner

*Primary Examiner*—Boris Chervinsky
(74) *Attorney, Agent, or Firm*—Oliff & Berridge PLC

(57) ABSTRACT

A circuit configuration member has a space capable of storing a resin in a liquid state is formed on the adhering face and on an inner side of the case main body. The adhering face of the heat radiating member and the circuit configuration member are adhered by an adhering member at inside of the space by integrally molding the case main body arranged to surround the circuit configuration member and the heat radiating member.

8 Claims, 2 Drawing Sheets

CIRCUIT CONFIGURATION MEMBER AND METHOD OF FABRICATING THE SAME

BACKGROUND OF THE INVENTION

1. Field of the Invention

The present invention relates to a circuit configuration member including a circuit configuration member including a power circuit, a case main body and a heat radiating member and a method of fabricating a circuit configuration member.

2. Description of the Related Art

In a related art, there is generally known an electric connection box constituting an electricity distributing circuit by a plurality of pieces of bus bars and integrating a switch element or the like thereto by distributing power from a common vehicle-mounted power source to respective electronic units. As a method of waterproofing the electric connection box, there is adopted a method of fitting; cases divided in two covering a power circuit in watertight and maintaining inside thereof in airtight.

In recent years, by realizing small-sized formation an electric connection box has been developed and a method of waterproofing the electric connection box has variously been conceived. For example, JP-A-2003-164039 describes a waterproofing method in which a circuit configuration member including a power circuit is fixed at inside of a case having a waterproof wall, the case and a heat radiating member are fixed via a seal member to thereby produce a space in which leakage is not brought about at a bonding face of the waterproof wall of the case and a heat radiating member, thereafter, a cover is covered on an upper end of the waterproof wall and both members are bonded by ultrasonic wave welding or the like to thereby hermetically seal inside of the waterproof wall.

SUMMARY OF THE INVENTION

However, according to JP-A-2003-164039, it is not described specifically how the sealing is carried out by which seal member, for example, when a seal member such as a packing is used, it is necessary to work a groove for mounting the seal member at the case main body which restricts small-sized formation and working accuracy is needed for fitting the seal member to the groove and therefore, cost of parts is increased. Further, cost is required for sealing operation such that operation for integrating the seal member is needed and so on.

It is an object of the invention to provide a circuit configuration member capable of carrying out waterproofing by a small-sized and low cost structure and by simpler step.

According to first aspect of the invention, a circuit configuration member including: a circuit configuration member including a power circuit; a case main body surrounding the circuit configuration member and a heat radiating member having an adhering face adhering the circuit configuration member and the case main body, wherein a space capable of storing a resin in a liquid state is formed on the adhering face and on an inner side of the case main body, when the adhering face of the heat radiating member and the circuit configuration member are adhered by an adhering member, and the case main body arranged to surround the circuit configuration member and the adhering face of the heat radiating member are adhered by the adhering member.

By thus configuration, by adhering the case main body and the heat radiating member by the adhering member, the space for filling the waterproof resin can be formed by a simple structure, and by using the adhering member, a clearance between the case main body and the heat radiating member can firmly be closed. Therefore, even when the waterproof resin in the liquid state is injected into the space, leakage is, not brought about and the waterproof layer for waterproofing the circuit configuration member can be formed by a simple step of lowering the fluidity of the waterproof resin at inside of the space.

According to second aspect of the invention, the adhering member is a sheet.

By thus configuration, by adhering the case main body and the heat radiating member by utilizing the adhering sheet for adhering the circuit configuration member and the heat radiating member, the circuit configuration member, the heat radiating member, the case main body and the heat, radiating member are adhered by one time adhering operation and the space for filling the waterproof resin can be formed by a simple step.

According to third aspect of the invention, a circuit configuration member including a circuit configuration member including a power circuit; a case main body surrounding the circuit configuration member; and a heat radiating member having an adhering face adhering the circuit configuration member and the case main body, wherein a space capable of storing a resin in a liquid state is formed on the adhering face and on an inner side of the case main body, and the adhering face of the heat radiating member and the circuit configuration member are adhered by an adhering member at inside of the space by integrally molding the case main body arranged to surround the circuit configuration member and the heat radiating member.

By thus configuration, by integrally molding the case main body and the heat radiating member, the space for filling the waterproof resin can easily be formed.

According to fourth aspect of the invention, a method of fabricating a circuit configuration member including fabricating the circuit configuration member; filling a waterproof resin in a liquid state to a height at least sealing a portion of the circuit configuration member including an object of waterproof at inside of the space formed by the adhering face of the heat radiating member and an inner side face of the case main body; and forming a waterproof layer by lowering a fluidity of the waterproof resin.

By thus method, the circuit configuration member capable of forming the space for filling the waterproof resin can be fabricated by a simple step, by injecting the waterproof resin in the liquid state into the space, the excellent waterproof layer can be formed by solidifying the waterproof resin as it is at inside of the space of the inner side of the case without bringing about leakage of the waterproof resin and therefore, waterproofing of inside of the circuit configuration member can easily be carried out.

According to fifth aspect of the invention, arranging the circuit configuration member and the case main body at the adhering face of the heat radiating member via the adhering sheet, when the circuit configuration member is fabricated; and adhering the circuit configuration member and the case main body to the adhering face of the heat radiating member by thermally pressing the adhering sheet.

By thus method, by adhering the case main body and the heat radiating member by utilizing the adhering sheet for adhering the circuit configuration member and the heat radiating member, the clearance between the case main body and the heat radiating member can firmly be closed by a simple structure and by one time adhering operation.

According to sixth aspect of the invention, forming the waterproof layer by subjecting the waterproof resin in the liquid state filled in the space to gelation or curing, when the waterproof layer is formed.

By thus methods the circuit configuration member described in any one of claims 1 through 3 capable of forming the space for filling the waterproof resin can be fabricated by a simple step, by injecting the waterproof resin in the liquid state into the space, the excellent waterproof layer can be formed by solidifying the waterproof resin as it is at inside of the space of the inner side of the case without bringing about leakage of the waterproof resin and therefore, waterproofing of inside of the circuit configuration member can easily be carried out.

According to seventh, aspect of the invention, the power circuit is provided with an electronic part having a leg-like terminal, and when the waterproof layer is formed, the waterproof resin in the liquid state is filled to a height of sealing at least the leg-like terminal of the electronic part.

By thus configuration, when the electric circuit is provided with the electric part having the leg-like terminal, sufficient waterproof performance is achieved by filling the waterproof resin to seal at least the leg-like terminal.

BRIEF DESCRIPTION OF THE DRAWINGS

These and other objects and advantages of this invention will become more fully apparent from the following detailed description taken with the accompanying drawings in which.

DESCRIPTION OF THE PREFERRED EMBODIMENTS

Figure 1:
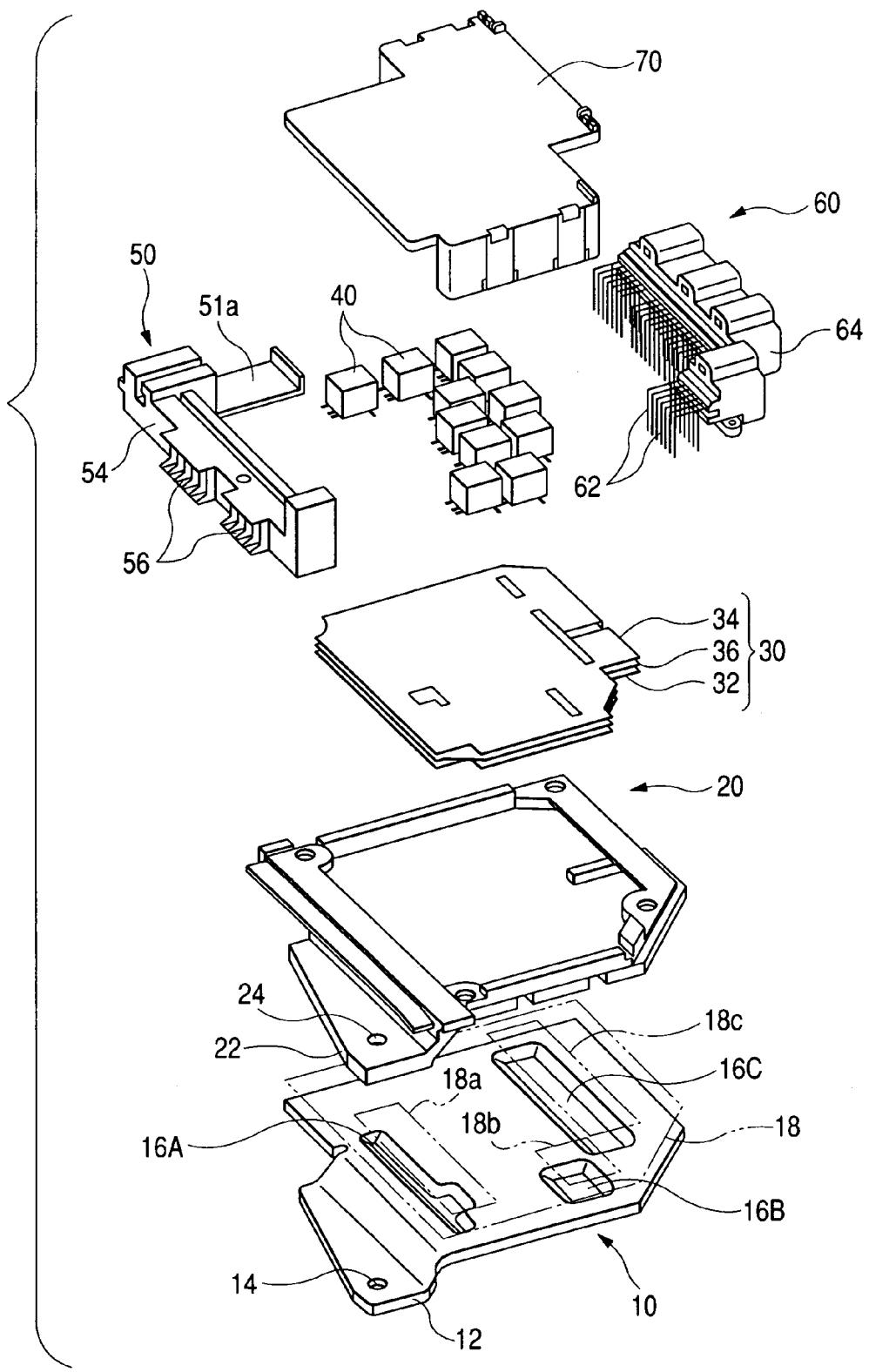
FIG. 1 is disassembled perspective view of a circuit configuration member according to an embodiment of the invention.

An explanation will be given of a circuit configuration member according to an embodiment of the invention in reference to FIG. 1 and FIG. 2.

The circuit configuration member is provided with a heat radiating member 10, a case main body 20, and a circuit board 30, and a circuit configuration member is constituted by mounting pertinent mounting parts to the circuit board 30. The mounting parts include a board mounting type relay switch 40, a power source inputting connector 50, an externally connecting connector 60, and other circuit elements of a semiconductor element and a resistance element. Further, a cover 70 covering the circuit board 30 is mounted onto the two connectors 50, 60.

An adhering face of the heat radiating member 10 and the circuit configuration member is adhered by an adhering sheet 18 (omitted in FIG. 2) and the case main body 20 and the adhering face of the heat radiating member 10 are adhered by the adhering sheet 18.

Next, an explanation will be given of a method of fabricating a circuit configuration member in which the circuit configuration member on an inner side of the case is waterproofed according to the invention.

The circuit board 30 is fabricated by adhering a plurality of bus bars 32 and a printed circuit board 34 via an adhering sheet 36. The circuit configuration member is constructed by mounting parts of the relay switch element 40, the power source inputting connector 50, and the externally connecting connector 60 onto the circuit board 30. The circuit board 30 includes a contact side terminal and a coil side terminal which are leg-like terminals, the contact side terminal is mounted onto a pertinent one of the bus bars 32 via a through hole provided at the printed circuit board 34 and the coil side terminal is mounted onto the printed circuit board 34.

With regard to board connecting terminals 52, 62 of the respective connectors 50, 60, the terminals 52, 62 are connected to the circuit board 30 in a state of penetrating the circuit board 30. Thereby, front ends of the terminals 52, 62 constitute projected portions projected from a rear face of the circuit board 30.

The circuit configuration member constructed in this way and the case main body 20 having inner side faces capable of surrounding the circuit configuration member are arranged on the adhering face of the heat radiating member 10 via the adhering sheet 18. A bottom face of the case main body 20 is constituted by a plane and by bringing the bottom face into contact with the adhering face of the heat radiating member 10, the inner side faces of the case main body 20 and the adhering face of the heat radiating member 10 form a space in a recessed shape having side faces and a bottom face.

The heat radiating member 10 includes recesses 16A, 16B, 16C for avoiding interference with projected portions from the rear face of the circuit board 30 at pertinent locations. Further, also the adhering sheet 18 includes through holes 18a, 18b, 18c at positions the same as positions of the recesses of the heat radiating member 10.

The adhering sheet 18 is provided with an area to a degree the same as that of the adhering face of the heat radiating member 10 for arranging the case main body 20, and as a material therefor, epoxy resin or the like having high insulating performance for a base material including a filler (for example, alumina) excellent in thermal conductivity is preferable. Although a size of the adhering sheet 18 is constituted by a size to the degree the same as that of the adhering face of the heat radiating member 10 for arranging the case main body 20, the size is not necessarily needed but in order to achieve the effect of the invention, the size of the adhering sheet 18 may be a size including at least the bottom face of the case main body 20 and a size capable of interposing the adhering sheet 18 between the bottom face and the heat radiating member 10.

When the circuit configuration member and the case main body 20 are arranged on the adhering face of the heat radiating member 10 via the adhering sheet 18, the heat radiating member 10, the adhering sheet 18, the circuit configuration member and the case main body 20 are relatively positioned such that the projected portion from the rear face of the circuit configuration member is disposed at the position of the recess of the heat radiating member via the through hole of the adhering sheet 18 and an outer shape of the case main body 20 and an outer shape of the heat radiating member 10 coincide with each other.

Thereafter, by heating the total to pertinent temperature while maintaining the overlapped state and pressing a face of the circuit configuration member and a plurality of points on the case main body 20 by a press apparatus in an upper and down direction to completely cure the adhering sheet 18, the circuit configuration member and the case main body 20 can be adhered to the adhering face of the heat radiating member 10 by including a medium by the adhering sheet 18 by one time adhering operation. Further, by thermally pressing the adhering sheet 18 interposed between the bottom face of the case main body 20 and the adhering face of the heat radiating member 10, a clearance between the bottom face and the adhering face of the heat radiating member 10 can firmly be closed.

By injecting waterproof resin in a liquid state into a space formed by the inner side faces of the case main body 20 and the adhering face of the heat radiating member 10 in the adhering step, at least to a height of sealing a portion of the circuit configuration member including an object of waterproof (for example, height of two-dotted chain line 38 of FIG. 2 for sealing the leg-like terminal of the relay switch 40) and leaving the resin as it is (adding a curing agent depending on the waterproof resin), gelation is constituted or the resin is cured. Thereby, a waterproof state is constituted by forming a waterproof layer for sealing the portion of the circuit configuration member for mounting the respective elements. Further, when the degree of gelation or curing is at least a degree of loosing a fluidity when the circuit configuration member is installed in a horizontal state, the waterproof layer can be formed.

Further, by providing slits or through holes at the circuit board 30 (bus bars 32, adhering sheet 34, printed circuit board 36) above the recesses 16A, 16B, 16C, the waterproof resin can be filled also to intervals between the portions of the terminals 52, 62 connected to the circuit board 30 projected from the rear face of the circuit board 30 and the recesses 16A, 16B, 16C of the heat radiating member 10 via the slits or the through holes and insulating performance between the terminals 52, 62 and the heat radiating member can be ensured.

In the above-described step of forming the waterproof layer, since the clearance between the bottom face of the case main body 20 and the adhering face of the heat radiating member 10 is firmly closed by thermally pressing the adhering sheet 18 in the above-described adhering step and therefore, even when the waterproof resin in the liquid state is injected into the space formed by the inner side faces of the case main body 20 and the adhering face of the heat radiating member 10, leakage is not brought about and the excellent waterproof layer can be formed by solidifying the waterproof resin as it is at inside of the space.

Here, although the waterproof resin in the liquid state may be provided with at least electrically insulating performance, it is preferable that the waterproof resin is excellent in heat resistance or cold resistance, specifically, it is preferable to use silicone species resin or urethane species resin or the like.

By mounting the cover 70 finally, the circuit configuration member is finished.

Although according to the embodiment, the circuit configuration member, the heat radiating member 10, the case main body 20 and the heat radiating member 10 are adhered by using one sheet of the adhering sheet 18, the space capable of storing the waterproof resin in the liquid state can be formed by adhering the circuit configuration member and the case main body 20 to the adhering face of the heat radiating member 10 by coating an adhering member to the adhering face of the heat radiating member without using the adhering sheet. In that case, the adhering member is coated to draw a closed diagram without cut at a bonding face of the bottom face of the case main body 20 and the adhering face of the heat radiating member 10 in order to firmly prevent the clearance between the case main body 20 and the heat radiating member 10.

Further, the space capable of storing the waterproof resin in the liquid state can also be formed by integrally molding the case main body 20 and the heat radiating member 10. For example, the case main body 20 and the heat radiating member 10 can integrally be molded by setting the heat radiating member 10 at inside of an injection molding die and injecting molten resin which is a material of the case main body 20 into the die.

The heating member according to the invention is not limited to a member in a plate-like shape but may be a member in a block-like shape integrally formed with, for example, a number of sheets of fins.

Figure 2:
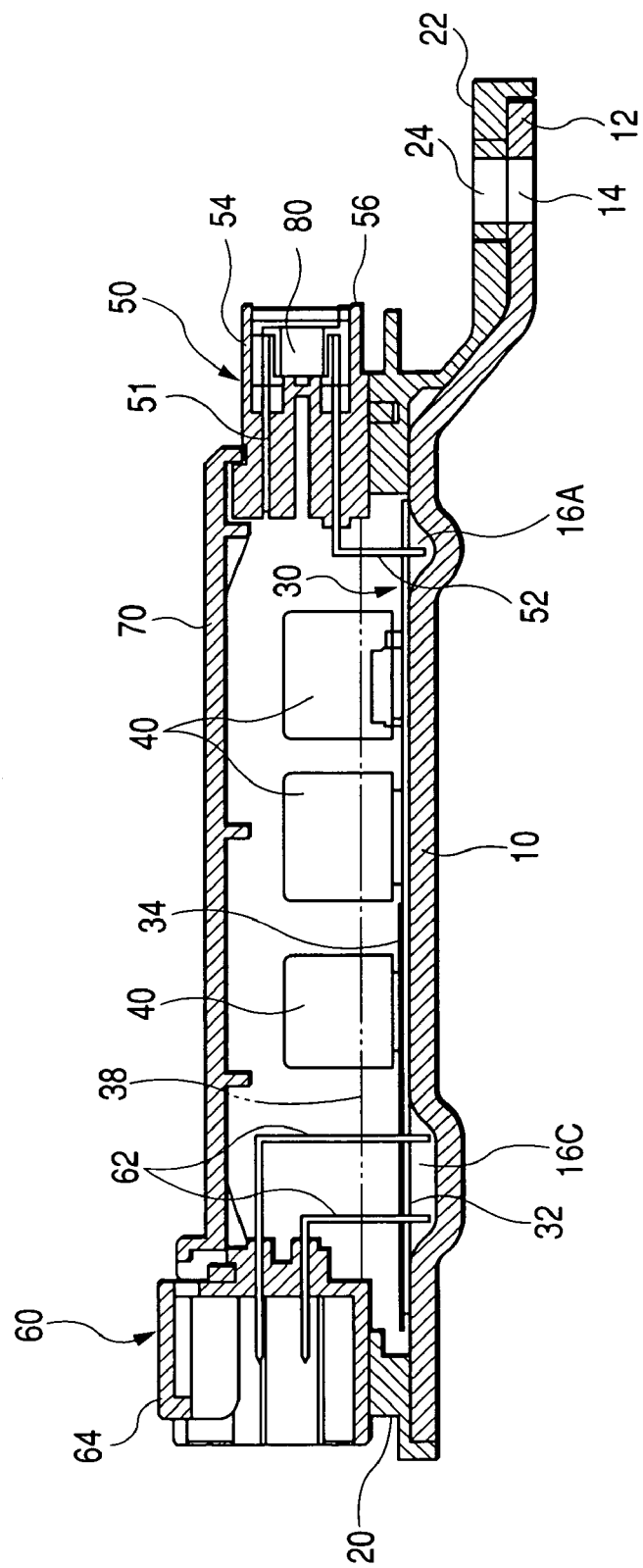
FIG. 2 is a sectional front view of the circuit configuration member

Although according the embodiment shown in FIG. 1, the heat radiating member 10 and the case main body 20 are adhered by thermally pressing the adhering sheet 18, when the adhering sheet 18 is constituted by a size to a degree of having an area slightly larger than an area on a plane formed by the bottom face of the case main body, the heat radiating member 10 and the case main body 20 may be bonded by a separate step of screwing or the like.

Further, the connectors 50, 60 are not necessarily needed but a connector can also be formed by extending an end portion of the bus bar 32 disposed at an edge of the circuit board 30.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A circuit configuration assembly, comprising:
   a circuit configuration member including a power circuit;
   a case main body surrounding the circuit configuration member; and
   a heat radiating member having an adhering face adhering the circuit configuration member and the case main body by an adhering member,
   wherein:
   a space configured to store a resin in a liquid state is defined by the adhering face of the heat radiating member and an inner side of the case main body.

2. The circuit configuration assembly according to claim 1, wherein the adhering member is a sheet.

3. The circuit configuration assembly according to claim 1, wherein the resin is a waterproofed member.

4. The circuit configuration assembly according to claim 1, wherein the resin is an insulating member.

5. A circuit configuration assembly, comprising:
   a circuit configuration member including a power circuit;
   a heat radiating member having an adhering face adhering the circuit configuration member by an adhering member;
   a case main body surrounding the circuit configuration member integrally molded to the adhering face of the heat radiating member; and
   wherein:
   a space configured to store a resin in a liquid state is defined by the adhering face of the heat radiating member and an inner side of the case main body.

6. The circuit configuration assembly according to claim 5, wherein the resin is an insulating member.

7. The circuit configuration assembly according to claim 5, wherein the adhering member is a sheet.

8. The circuit configuration assembly according to claim 5, wherein the resin is a waterproofed member.

* * * * *